(12) United States Patent
Kalhan et al.

(10) Patent No.: US 11,153,027 B2
(45) Date of Patent: Oct. 19, 2021

(54) LAYERED MODULATION FOR MACHINE TYPE COMMUNICATION (MTC) TRANSMISSIONS FROM MULTIPLE TRANSCEIVER STATIONS

(71) Applicant: Kyocera Corporation, Kyoto (JP)

(72) Inventors: Amit Kalhan, San Diego, CA (US); Henry Chang, San Diego, CA (US)

(73) Assignee: Kyocera Corporation, Kyoto (JP)

( * ) Notice: Subject to any disclaimer, the term of this patent is extended or adjusted under 35 U.S.C. 154(b) by 341 days.

(21) Appl. No.: 16/328,655

(22) PCT Filed: Sep. 11, 2017

(86) PCT No.: PCT/US2017/051005
§ 371 (c)(1),
(2) Date: Feb. 26, 2019

(87) PCT Pub. No.: WO2018/049347
PCT Pub. Date: Mar. 15, 2018

(65) Prior Publication Data
US 2021/0175998 A1    Jun. 10, 2021

Related U.S. Application Data

(60) Provisional application No. 62/393,237, filed on Sep. 12, 2016, provisional application No. 62/398,654, (Continued)

(51) Int. Cl.
*H04L 1/00* (2006.01)
*H04W 4/70* (2018.01)
(Continued)

(52) U.S. Cl.
CPC .......... *H04L 1/0003* (2013.01); *H03M 13/25* (2013.01); *H04L 1/0014* (2013.01);
(Continued)

(58) Field of Classification Search
CPC . H04L 1/0014; H04L 1/0077; H04L 12/1881; H04L 1/0003; H04L 5/0035;
(Continued)

(56) References Cited

U.S. PATENT DOCUMENTS

2010/0120360 A1   5/2010  Haustein et al.
2011/0135029 A1*  6/2011  Jianming ............ H04L 27/3488
                                                      375/286

(Continued)

FOREIGN PATENT DOCUMENTS

KR    10-2008-0108320 A    12/2008

*Primary Examiner* — Faisal Choudhury (57) ABSTRACT

A first transceiver station broadcasts information to machine type communication (MTC) devices in the coverage area of the transceiver station using layered modulation where MTC devices receiving the broadcast above a signal quality threshold can recover the MTC information by applying a high modulation order. MTC devices receiving the broadcast below the quality threshold, recover a portion of the MTC information by applying a lower modulation order and recover the remaining portion of the MTC information transmitted from a second transceiver.

19 Claims, 7 Drawing Sheets

Related U.S. Application Data filed on Sep. 23, 2016, provisional application No. 62/398,664, filed on Sep. 23, 2016.

(51) Int. Cl.
| | |
|---|---|
| *H04W 48/10* | (2009.01) |
| *H04L 12/18* | (2006.01) |
| *H04L 27/34* | (2006.01) |
| *H03M 13/25* | (2006.01) |
| *H04L 5/00* | (2006.01) |
| *H04L 7/06* | (2006.01) |

(52) U.S. Cl.
CPC .......... *H04L 1/0077* (2013.01); *H04L 5/0035* (2013.01); *H04L 7/065* (2013.01); *H04L 12/1881* (2013.01); *H04L 27/3488* (2013.01); *H04W 48/10* (2013.01); *H04W 4/70* (2018.02)

(58) Field of Classification Search
CPC ...... H04L 7/065; H04L 27/3488; H04W 4/70; H04W 48/10; H03M 13/25
USPC ........................................................ 370/312
See application file for complete search history.

(56) References Cited

U.S. PATENT DOCUMENTS

| | | | |
|---|---|---|---|
| 2012/0106410 A1 | 5/2012 | Jia et al. | |
| 2012/0170619 A1* | 7/2012 | Chang | ................... H04L 1/0077 375/211 |
| 2015/0139120 A1 | 5/2015 | ElArabawy et al. | |
| 2015/0326360 A1 | 11/2015 | Malladi et al. | |

\* cited by examiner

LAYERED MODULATION FOR MACHINE TYPE COMMUNICATION (MTC) TRANSMISSIONS FROM MULTIPLE TRANSCEIVER STATIONS

CLAIM OF PRIORITY

The present application claims priority to Provisional Application No. 62/393,237, entitled "LAYERED MODULATION FOR NARROWBAND BROADCAST TRANSMISSIONS TO MTC DEVICES", filed Sep. 12, 2016, to Provisional Application No. 62/398,654, entitled "LAYERED MODULATION WITH MULTIPLE SOURCES FOR NARROWBAND BROADCAST TRANSMISSIONS TO MTC DEVICES", filed Sep. 23, 2016 and to Provisional Application No. 62/398,664, entitled "LAYERED MODULATION WITH MULTIPLE ENCODERS FOR NARROWBAND BROADCAST TRANSMISSIONS TO MTC DEVICES", filed Sep. 23, 2016, all assigned to the assignee hereof and hereby expressly incorporated by reference in their entirety.

RELATED PATENT APPLICATIONS

The present application is related to PCT Patent Application No. PCT/US2017/051003, entitled "LAYERED MODULATION FOR MACHINE TYPE COMMUNICATION (MTC) TRANSMISSIONS", and PCT Patent Application No. PCT/US2017/051009, entitled "LAYERED MODULATION WITH MULTIPLE CODING RATES FOR MACHINE TYPE COMMUNICATION (MTC) TRANSMISSIONS", both filed concurrently with this application, assigned to the assignee hereof, and hereby expressly incorporated by reference herein.

FIELD

This invention generally relates to wireless communications and more particularly to devices and methods for transmitting information to machine type communication (MTC) devices using layered modulation from multiple transceiver stations.

BACKGROUND

Machine type communication (MTC) is a form of data communication which involves one or more entities that do not necessarily need human interaction. Depending on the particular implementation, an MTC device may communicate with one or more servers or with other devices. The network operator provides network connectivity to MTC server(s) regardless of whether the MTC server is controlled by the network operator. An MTC device is typically a user equipment (UE) device that is equipped for Machine Type Communication and communicates through a public land mobile network (PLMN) with MTC Server(s) and/or other MTC Device(s). In some situations, an MTC device might also communicate locally through a hardwired or wireless connection with other entities.

MTC devices are increasingly being used in a variety of applications. Examples of some of the general areas of use include security, tracking, health, payment, remote diagnostics, metering and consumer electronics. Some of the many specific applications include surveillance system control, control of physical access (e.g. to buildings), fleet management, order management, asset tracking, navigation, traffic information, road tolling, point of sales, vending machines, gaming machines, vital signs monitoring, web access telemedicine points, remote maintenance and control of sensors, lighting, pumps, valves, and elevators, vehicle diagnostics, metering of power, gas, water and heating, grid control, and management and control of digital photo frames, cameras and eBooks.

SUMMARY

A first transceiver station broadcasts information to machine type communication (MTC) devices in the coverage area of the transceiver station using layered modulation where MTC devices receiving the broadcast above a signal quality threshold can recover the MTC information by applying a high modulation order. MTC devices receiving the broadcast below the quality threshold, recover a portion of the MTC information by applying a lower modulation order and recover the remaining portion of the MTC information transmitted from a second transceiver.

DETAILED DESCRIPTION

As mentioned above, MTC devices are increasingly being used for numerous applications where the MTC devices exchange information with other devices and servers. The network facilitating communication with the MTC devices must handle the increased traffic due to the numerous MTC devices while accommodating the particular requirements and limitations of the MTC devices. One important consideration includes minimizing the power consumption of the MTC device. As a result, it is advantageous to minimize the time that the MTC device transmits and receives data. In addition, in some situations, it is critical that the information be received uninterrupted at the MTC device. For example, firmware updates should not be interrupted.

Communication systems employ a variety of transmission techniques to maximize efficiency of network resources. One example includes broadcasting information to multiple devices simultaneously rather than establishing a dedicated channel to each of the devices. The same information may be broadcasted from several base stations to devices in multiple service areas. In other situations, however, the information is broadcasted in a single service area or cell. In systems operating in accordance with at least some revisions of The Third Generation Partnership Project (3GPP) Long Term Evolution (LTE) specification, this broadcast is typically referred to as a single cell—point to multipoint (SC-PTM) transmission and is performed using Multimedia Broadcast Multicast Services (MBMS). For SC-PTM transmission of MBMS in accordance with 3GPP specifications, MBMS is transmitted in the coverage of a single cell where one Single Cell-Multicast Control Channel (SC-MCCH) and one or more single cell—multicast traffic channel(s) SC-MTCH(s) are mapped on a Downlink Shared Channel (DL-SCH). For conventional SC-PTM, the base station (eNB) and the core network (CN) schedule the SC-PTM transmissions. In particular, the SC-MCCH and SC-MTCH transmissions are each indicated by a logical channel specific Radio Network Temporary Identifier (RNTI) on the Physical Downlink Shared Channel (PDSCH). There is a one-to-one mapping between Temporary Mobile Group Identity (TMGI) and G-RNTI used for the reception of the DL-SCH to which a SC-MTCH is mapped. As with all existing broadcast mechanisms, including SC-PTM, the broadcast is not guaranteed to reach all UE devices within a cell. With conventional techniques, the broadcast multicast or Single-cell Point-to-Multipoint (SC-PTM) transmissions are designed to meet a target number of UE devices to be able to decode the data packets successfully. In most cases the broadcast transmissions are designed to provide a Block Error Rate less than one percent (BLER <1%) for 95% of the UE devices in the cell.

If higher robustness is needed (e.g., for firmware downloads where none of the data can be dropped for the download to be successful), and if the worst-channel condition information is available (e.g., with Channel State Information (CSI) feedback) then one of the viable solutions is for the base station to transmit the data robust enough to overcome those channel conditions. This may lead to increased use of resources, however, if broadcast data needs to be transmitted at lower MCS (to allow cell edge UEs to receive the broadcast successfully). Alternatively, higher power broadcast transmissions may be used, but resulting in increased interference to neighboring eNBs.

Other approaches for higher broadcast robustness are based on the use of Hybrid Automatic Repeat Request (HARQ) feedback from the receivers which were unable to decode the data successfully. The base station can then apply link-adaptation for the retransmissions. However, several factors need to be considered. If HARQ retransmissions or any type of feedback is needed from the UE it will be necessary for the MTC device to transmit feedback information to the eNB. This is not desirable for MTC devices, since the main criteria for the MTC UE device includes reducing power consumption. However, unlike other non-MTC applications, latency is generally not an issue for MTC UEs. Therefore, solutions for higher robustness could be achieved at the expense of higher latency.

Assuming feedback is not provided to the base station (eNB), it will be necessary for the eNB to decide how the SC-PTM transmissions should be configured. In particular, depending on the intended coverage of the SC-PTM transmissions, the base station (eNB) needs to decide the Modulation and Coding Scheme (MCS) configuration used for the transmissions. With higher MCS, more traffic data can be sent in a shorter duration giving MTC UEs more time to sleep and conserve power, while lower MCS configuration allows better penetration into all coverage areas but at a much lower data rate requirement more power consumption from MTC device.

With conventional techniques, SC-PTM transmission is only transmitted at a particular modulation order, one that will typically cover up to 90 percent of devices in its cell. Although a lower modulation order may be used to increase the percentage of coverage, devices that can successfully receive the data packet at a higher modulation order will need to stay awake longer since the same data packet will need to be transmitted over multiple transmissions at the lower modulation order. In other words, majority of the devices will suffer (power-consumption-wise) for the benefit of the few devices that cannot receive the packet at the higher modulation order. Under the conventional techniques, a device that cannot receive SC-PTM has the option to obtain the same data packets over Unicast service. However, unicast service is not preferable for a MTC device due to higher power consumption since HARQ feedback is assumed. Furthermore, additional power will be consumed if the MTC device needs to transition to the connected mode to receive the unicast service and the MTC device was originally in the Idle mode (to conserve power). Note that SC-PTM can be received while the MTC device is in the Idle mode. This is also undesirable from a network resource perspective as the main objective of SC-PTM is to be able to broadcast information to many devices that are interested in the same contents without the need to for Unicast delivery. As discussed below, these considerations are addressed by applying layered modulation to broadcasted MTC information from a first transceiver station that allows an MTC device in lower signal quality area of the first transceiver to recover a portion of the MTC information using a lower modulation order and to recover the remaining portion of MTC information from a second transceiver station.

Figure 1:
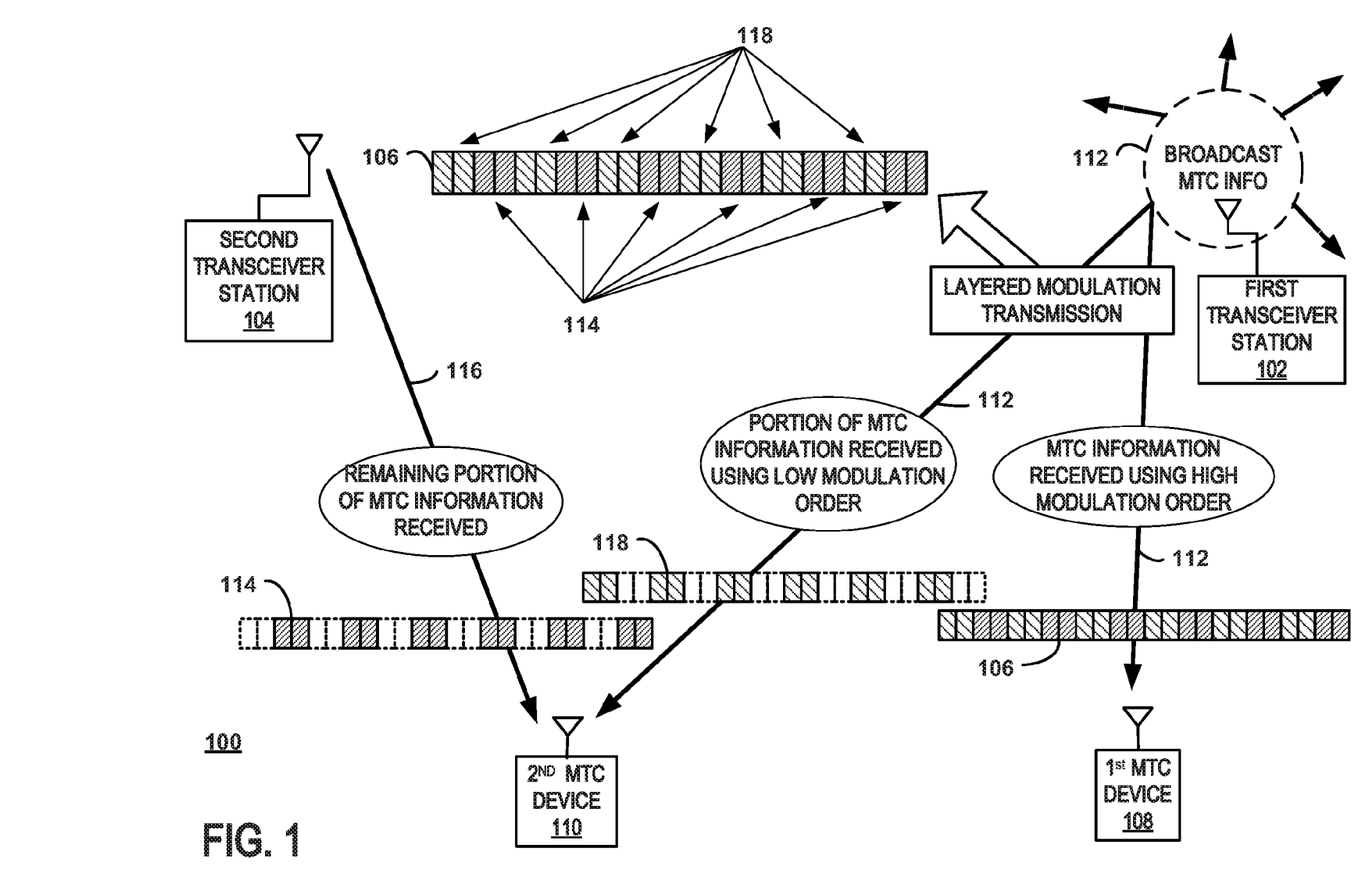
FIG. 1 is a block diagram of a communication system including a first transceiver station and a second transceiver station providing MTC information to MTC devices within the service areas of the transceiver stations.

FIG. 1 is a block diagram of a communication system 100 including a first transceiver station 102 and a second transceiver station 104 providing MTC information 106 to MTC devices 108, 110 within the service areas of the transceiver stations 102, 104. The transceiver stations 108, 110 can be any type of base station, access point, radio head, eNodeB, standalone relay station, base station with relay functionality, or other device capable of transmitting signals within a geographical service area. Two examples are discussed below where, in one example, both transceiver stations 102, 104 are base stations. In another example, the first transceiver station 102 is a base station such as an eNodeB and the second transceiver station 104 is a relay station. Other types and combinations of transceiver stations may be used.

The MTC devices 108, 110 are devices that employ machine type communication (MTC) and are otherwise user equipment (UE) devices operating on the communication system 100. For the examples herein, the communication system 100 operates in accordance with at least one revision of a 3GPP communication specification although the principles and techniques discussed may be applied to other types of systems in some circumstances. The transceiver stations broadcast MTC information 106 within the cells using Multimedia Broadcast Multicast Services (MBMS) techniques for the example. Accordingly, the broadcast transmissions are SC-PTM transmissions. For the example of FIG. 1, the MTC information 106 is broadcast from the first transceiver station 102 using layered modulation in a first transmission 112 and at least some of the MTC information 114 is transmitted from the second transceiver station 104 in a second transmission 116.

The MTC information 106 is directed to multiple MTC devices such as the MTC devices 108, 110. For the example of FIG. 1, two MTC devices 108, 110 are shown although many situations may include numerous MTC devices. For the example, a first MTC device 108 receives the signals transmitted from the first transceiver station 102 at a first signal quality level and a second MTC device 110 receives the signals transmitted from the second transceiver station 104 at second signal quality lower than the first signal quality. The difference in signal quality may be due to a variety of conditions such a noise, signal attenuation due to propagation loss, obstacles in the signal path and receiver quality. For example, the first MTC device 108 may be closer to the first transceiver station 102 than the second MTC device 110 and may therefore receive signals at a higher strength.

For the example of FIG. 1, the first transceiver station 102 broadcasts all of the MTC information 106 using layered modulation such that all of the MTC information 106 can be recovered by a MTC device using a high modulation order to demodulate the transmission and such that some of the MTC information can be recovered by a MTC device using a low modulation order lower than the high modulation order. The high modulation order can be used to successfully demodulate the signal when the signal quality of the received transmission is above a signal quality threshold.

Since the transmission 112 from the first transceiver station 102 includes all of the MTC information 106 in the example, the MTC information 106 can be recovered with successful demodulation of only the transmission 112 from the first transceiver station 102. In order to recover all bits of the MTC information from the transmission 112, however, the receiving MTC device must apply a higher modulation order to demodulate the transmission. A lower modulation order can be applied to recover a portion of the MTC information 118 contained in the transmission 112.

For the example of FIG. 1, the second MTC device 110 receives signals from the first transceiver station 102 below the signal quality threshold that allows demodulation of the transmission 112 using the higher modulation order. The second MTC device 110, however, applies the low modulation order to demodulate the transmission 112 and recovers a portion of the MTC information 118. The remaining portion of the MTC information 114 is received from the second transceiver station 104. The remaining portion of MTC information 114 may be transmitted at the low modulation order or the high modulation order depending on the implementation and/or circumstances. The remaining portion 114 may be transmitted as part of transmission that includes all of the MTC information or may be transmitted without other MTC information. For example, where the second transceiver station 104 is a base station broadcasting MTC information within its cell, the MTC information may be transmitted with layered modulation such that the remaining portion 114 can be recovered using the low modulation order.

Generally, using the higher modulation order will require fewer transmissions leading to less processing time than demodulating a higher number of transmissions at a lower modulation order to receive the same information. As a result, using a higher modulation order typically reduces the power consumption of the MTC device because the device spends less time receiving the transmissions and the time saved is used for sleep mode or in some other less active state. Although for the example all of the information is transmitted in a transmission from the first transceiver station, other techniques can be used where the information is received over some number of transmissions where the number of transmissions required to retrieve all of the information is less using higher modulation orders than the number required to receive the information using lower modulation orders.

Therefore, the first MTC device 108 demodulates the transmission 112 from the first transceiver station 102 using the high modulation order to recover the MTC information 106 with minimum power consumption by receiving the MTC information 106 within a minimized reception time period. The second MTC device 110 cannot use the high modulation order for demodulating the transmission 112 and uses the low modulation order to demodulate the layered modulation transmission 112 to receive a portion of the MTC information 118. The MTC device 110 recovers the remaining portion of the MTC information 114 by demodulating the signal 116 transmitted form the second transceiver station 104. The second MCT device 110, therefore, recovers all of the MTC information from information in multiple transmissions 112, 116 from multiple transceiver stations 102, 104.

Figure 2:
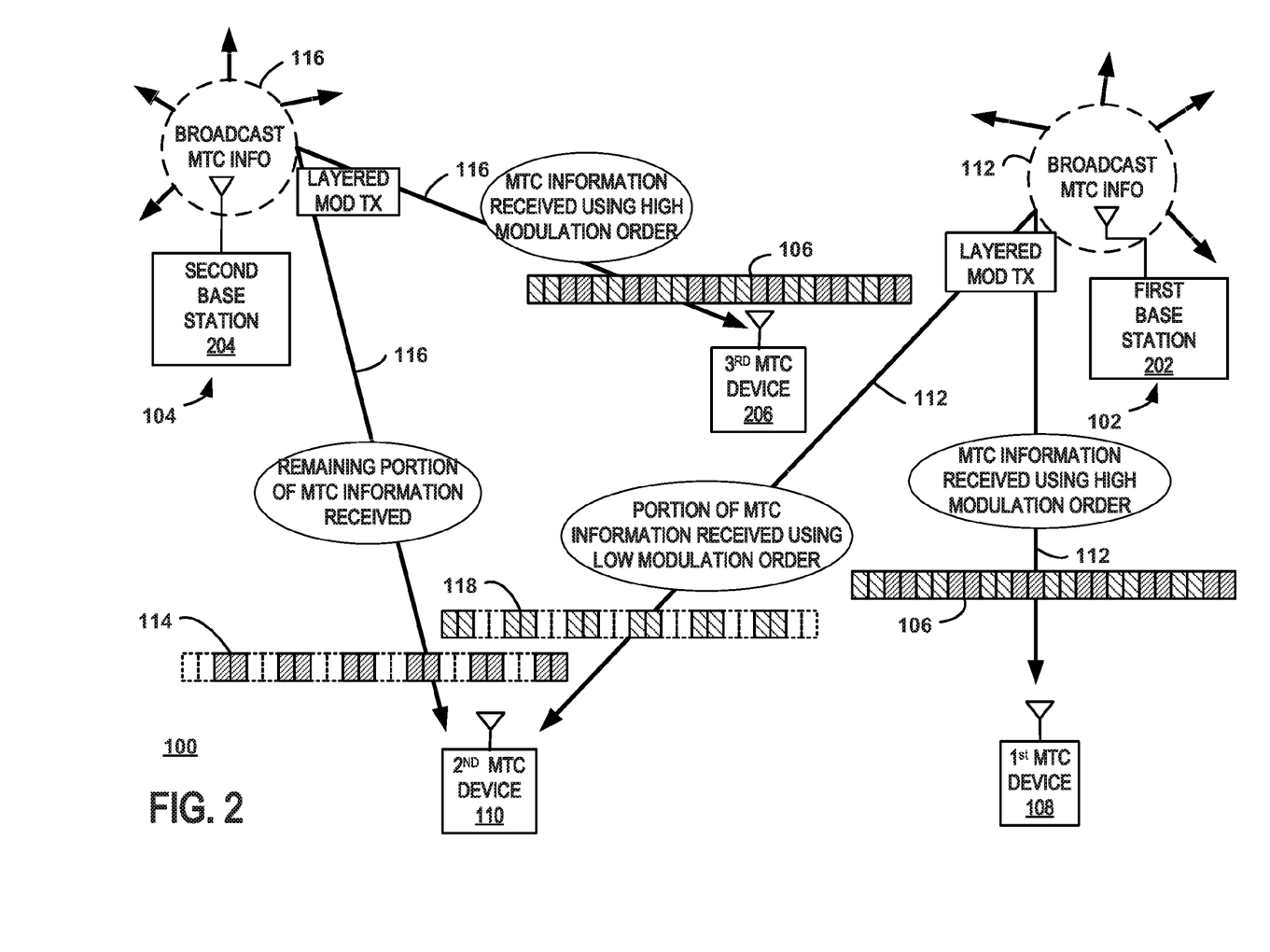
FIG. 2 is a block diagram of the communication system for an example where the first transceiver is a first base station and the second transceiver is a second base station.

FIG. 2 is a block diagram of the communication system 100 for an example where the first transceiver 102 is a first base station 202 and the second transceiver 104 is a second base station 204. For the example of FIG. 2, the first transceiver station 102 and the second transceiver station 104 are base stations such as eNBs, eNodeBs, access points, or any other devices performing similar tasks. Each base station 202, 204 provides wireless service within a geographical service area where the two areas at least partially overlap with each other. The second MTC device 110 can receive signals from both base stations 202, 204. For the example of FIG. 2, all of the MTC information 106 is included in the first transmission 112 from the first base station 202 and all of the MTC information 106 is included in the second transmission 116 from the second base station 204. As discussed below, however, the sequence of bits of the MTC information is different between the two transmissions 112, 116. Each base station broadcasts the MTC information 106 using layered modulation where a MTC device that receives a transmission above a signal quality threshold can recover the MTC information 106 demodulating the transmission using the high modulation order. Therefore, the first MTC device 108 can recover all of the MTC information 106 from the first transmission 112 using the high modulation order. A third MTC device 206 that receives the second transmission 116 from the second base station 104 above the signal quality threshold can also recover the MTC information 106 by using the high modulation order to demodulate the second transmission 116. For the example of FIG. 2, the second MTC device 110 does not receive either of the transmissions 112, 116 at a sufficiently high quality to allow demodulation of either transmission 112, 116 using the high modulation order. However, the second MTC device 110 recovers all of the MTC information 106 by using the low modulation order to recover a portion of the MTC information 118 from the first transmission 112 and to recover the remaining portion of the MTC information 114 from the second transmission 116 from the second base station 204.

Figure 3:
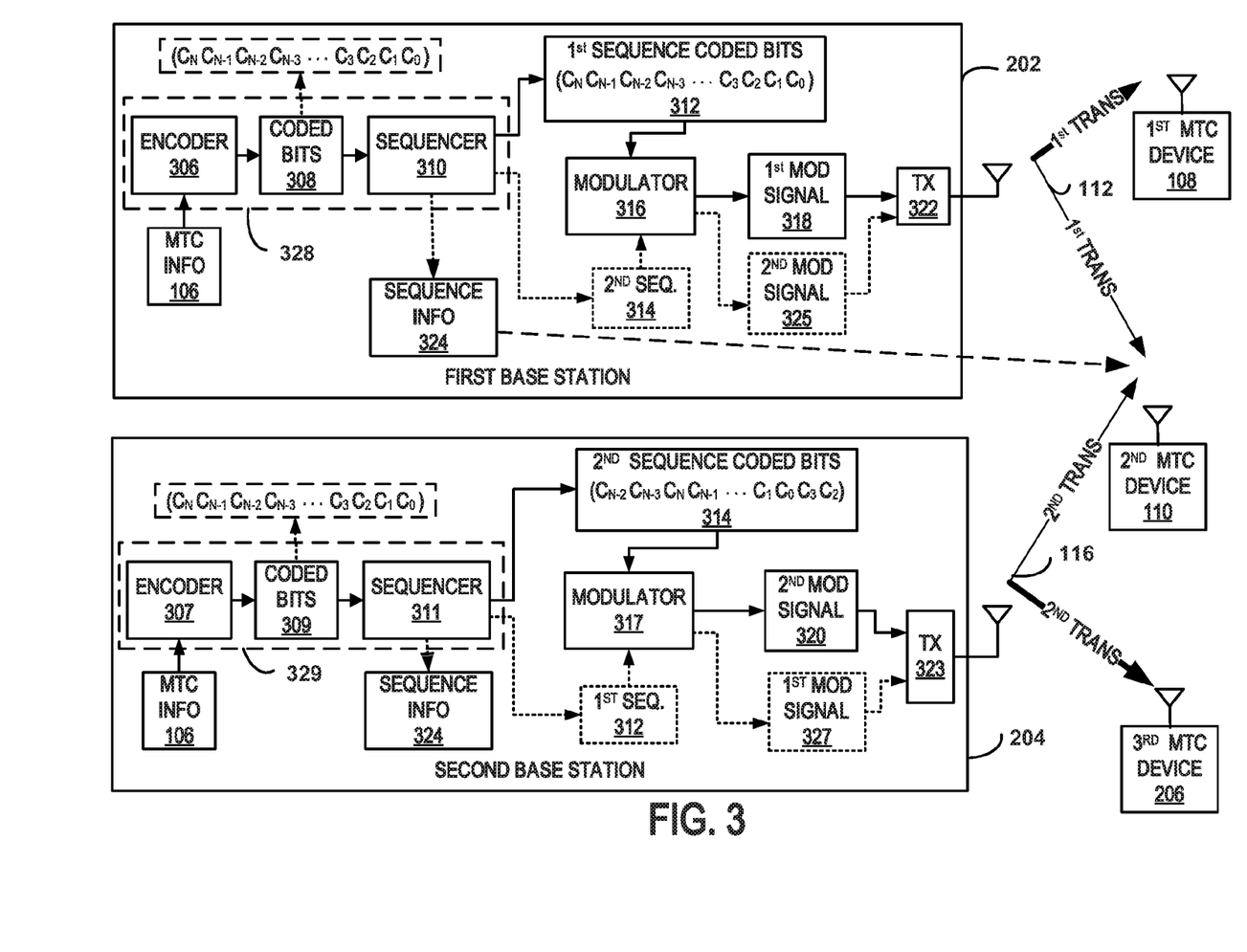
FIG. 3 is a block diagram of the system of FIG. 2 where the two base stations transmit encoded bits representing the MTC information to the MTC devices.

FIG. 3 is a block diagram of the system 100 of FIG. 2 where the two base stations transmit encoded bits representing the MTC information to the MTC devices. Each base station 202, 204 encodes and sequences the MTC information 106 into at least one sequence of coded bits, modulates the sequence of coded bits with layered modulation and transmits the modulated sequence. For the example, the sequence of bits in the transmission 116 from the second base station 204 is different from the sequence of bits in the first transmission 112 from the first base station 202. In some situations, a base station encodes and sequences the MTC information 106 into two sequences of coded bits, modulates the two sequences with layered modulation, and transmits each modulated sequence as a first transmission and second transmission. Such a technique is discussed in PCT Patent Application No. PCT/US2017/051003, entitled "LAYERED MODULATION FOR MACHINE TYPE COMMUNICATION (MTC) TRANSMISSIONS", filed concurrently with this application and hereby incorporated by reference in its entirety, herein. Such techniques allow multiple MTC devices in the service area of the base station to receive all of the MTC information in a single transmission using the high modulation order or to receive the MTC information over multiple transmissions using a lower modulation order. Therefore, in some situations, each base station 202, 204 encodes and sequences the MTC information 106 into two sequences of coded bits, modulates the two sequences with layered modulation, and transmits each modulated sequence as different transmissions to broadcast the information as two transmissions. As mentioned above, for the example, each base station at least broadcasts one transmission. Accordingly, in the interest of brevity and simplicity, multiple transmissions from the base stations is discussed below after the discussion of a single transmission from each base station 202, 204.

Each base station includes an encoder 306, 307 that encodes the MTC information 106 into a number of coded bits 308, 309. The resulting coded bits 308, 309 are used to generate sequences of coded bits. The sequencer 310 in the first base station 202 generates a first sequence of coded bits 312 based on the MTC information coded bits 308 and the sequencer 311 in the second base station 204 generates a second sequence of coded bits 314 based on the MTC information coded bits 309. For the example, the first sequence of coded bits 312 is the same as the sequence of the coded bits 308 and the second sequence of coded bits 314 is the coded bits 308, 309 with the two most significant bits (MSBs) of each set of four coded bits being replaced with the least significant bits (LSBs) of the set. For example, if the coded bits 308, 309 are represented with $C_N\ C_{N-1}\ C_{N-2}\ C_{N-3}\ \ldots\ C_3\ C_2\ C_1\ C_0$, then the first sequence of coded bits 312 is the same and the second sequence of coded bits 314 are represented as $C_{N-2}\ C_{N-3}\ C_N\ C_{N-1}\ \ldots\ C_1\ C_0\ C_3\ C_2$. Numerous other sequencing techniques can be used. In another situation, for example, the second sequence of coded bits 314 may be the reverse of the first sequence of coded bits 312.

The modulator 316 in the first base station 202 receives the sequence of coded bits 312 and applies layered modulation to generate a modulated signal 318 that contains all of the MTC information 106. The modulator 317 in the second base station 204 receives the sequence of coded bits 314 and applies layered modulation to generate a modulated signal 320 that contains all of the MTC information 106. For the example, the layered modulation includes two modulation orders including a high modulation order and a low modulation order. The terms "high" and "low" are used to designate the relative level of modulation order between the two orders. Therefore, the high modulation order has a higher order than the low modulation order although both can be higher or lower relative to other modulation orders. Examples of suitable modulation orders include quadrature amplitude modulation with different constellation sizes such as 4-QAM and 16-QAM modulation techniques. As is known, 4-QAM is a quadrature amplitude modulation scheme where the data is represented by a single symbol in each of four quadrants of a phase-amplitude representation. For 16-QAM, data is represented by four different symbols in each quadrant. As a result, 16-QAM allows for transmission of more data over time than 4-QAM but requires the receiver to be able to distinguish between smaller differences between phase and amplitude to identify symbols than 4-QAM. Each modulation order requires a minimum signal quality of the received signal at the receiver in order to adequately demodulate the signals and recover the data. Therefore, a received signal must meet a minimum signal quality threshold in order for the receiver to receive a 16-QAM signal. If the signal is transmitted at a higher modulation order while keeping the mean energy the same as the signal transmitted at a lower modulation order, the constellation points of the higher modulation order must be closer together. As a result, assuming the noise and interference level stays the same, it will be more difficult for the receiver to correctly demodulate the signal at higher modulation order.

The transmitter 322 in the first base station 202 transmits the first modulated signal 318 as the first transmission 112 within the service area of the first base station 202. The transmitter 323 in the second base station 204 transmits the second modulated signal 320 as the second transmission 116 within the service area of the second base station 204. The two signals are therefore broadcasted in the corresponding cell of each base station. As discussed above, MBMS techniques can be used to broadcast the transmissions 112, 116. For the example, the signals are transmitted using SC-PTM techniques in accordance with at least one revision of the 3GPP communication specification but with the additional features discussed herein. In some situations, the two transmissions 112, 116 are transmitted at the same time over two different channels. In the example for FIG. 3, however, the signals are transmitted at different times. In some situations, the signals are transmitted over the same channel at the same time. The traffic channel of SC-PTM is transmitted on PDSCH while the traffic channel for MBMS is transmitted over a MBSFN channel.

The lines representing the transmissions in FIG. 3 are shown with heavier lines to the first MTC device 108 and the third MTC device 206 heavier than the lines to the second MTC device 110 to indicate that the signals are being received at a higher quality at the first and third MTC devices 108, 206 than at the second MTC device 110. For the example, signal quality of the received transmission at the first MTC device 108 is sufficiently high to allow the first MTC device 108 to demodulate the first transmission 112 at the high modulation order (e.g., 16-QAM). For the example, signal quality of the received transmission at the third MTC device 206 is sufficiently high to allow the third MTC device 206 to demodulate the second transmission 116 at the high modulation order. The signal quality of the received transmissions at the second MTC device 106 is not sufficient to allow the second MTC device 110 to demodulate either transmission 112, 116 at the high modulation order (e.g., 16-QAM). The signal quality, however, is adequate for the second MTC device 110 to demodulate the transmissions at the low modulation order (e.g., 4-QAM). As a result, the first MTC device 108 and the third MTC device 206 can recover all of the MTC information 106 by applying the high modulation order to only one transmission. The second MTC device 110, however, applies the low modulation order to both transmissions 112, 116 to recover the MTC information 106. As a result, the first MTC device 108 and the third MTC device 206 will be in active mode for less time receiving the transmissions and will be in sleep mode longer thereby conserving power. As discussed above, this technique allows a greater number of MTC devices in the cell to receive the MTC information while allowing some MTC devices to conserve power by using the high modulation order to receive the MTC information.

In some situations, the sequences of coded bits are predetermined and static. In other circumstances, however, the sequence of the bits in one or more of the transmissions 112, 116, is dynamically changing or otherwise not known by the MTC devices 108, 110, 206. As a result, at least one of the base stations 202, 204 provides the ordering of the sequence(s) to the second MTC device 110. An example of suitable technique includes transmitting the sequence information 324 in a control signal such as a part of the control information provided in the SC-MCCH for SC-PTM and in the MCCH for MBSFN. For the example, the control channels are transmitted at a lower modulation order such that all UE devices are able to obtain the information throughout the cell coverage area. An example of another suitable technique for transmitting the sequence information includes broadcasting the information over a system broadcast message in a semi-static manner.

The technique discussed above can be generalized for layered modulation where the modulation order of the base component is represented by $2^p$ and the modulation order enhanced component is $2^r$. For the generalization, r and p are integers and r is greater than p. For the examples herein, r is also an integer multiple of p although systems can be implemented without this constraint in some circumstances. The number of retransmissions is equal to differences in the exponent of the order of the enhanced modulator and the exponent of the base modulation minus one. Therefore, if $2^p$ is the base modulator order and $2^r$ is the enhanced modulator order, then the number of retransmission is (r−p)/p and the total of number of transmissions (n) is equal to (r−p)/p+1. For example, for the situation where 4-QAM and 16-QAM are used, r is 4 and p is 2 and the number of retransmissions is (4−2)/2=1. The total number of transmissions is equal to (4−2)/2+1=2, n=2. In another example, where the enhanced modulator is 64-QAM and the base modulator is 4-QAM, r=6 and p=2 and the number of retransmissions is (6−2)/2=2.

In some situations, as mentioned above, one or both base station 202, 204 can transmit multiple layered transmissions that include the MTC information 206. For example, the sequencer 310 in the first base station 202 may generate the second sequence of coded bits 314 in addition to the first sequence of coded bits 312. The second sequence of coded bits 314 is modulated with layered modulation to generate another second modulated signal 325. The second modulated signal 325 is transmitted within the service area of the first base station 202 by the transmitter 322. For this example, the second modulated signal 325 contains the same information and sequence of coded bits at the second modulated signal 320. Since, however, the base stations 202, 204 are neighboring base stations, the two signals are transmitted within different channels to avoid interference. MTC devices within the service area of the first base station 202 that cannot receive the transmissions from the base station 202 above the signal quality threshold, may be able to demodulate both transmissions using the low modulation order to recover a portion of the MTC information from each transmission.

The second base station 204 can also transmit multiple layered modulation transmissions such that devices receiving signals below the signal quality threshold can recover the MTC information. For example, the sequencer 311 in the second base station 204 may generate the first sequence of coded bits 312 in addition to the second sequence of coded bits 314. The first sequence of coded bits 312 is modulated with layered modulation to generate another first modulated signal 327. The first modulated signal 327 is transmitted within the service area of the second base station 204 by the transmitter 323. For this example, the second modulated signal 327 contains the same information and sequence of coded bits at the first modulated signal 318. Since, however, the base stations 202, 204 are neighboring base stations, the two signals are transmitted within different channels to avoid interference.

The various functions and operations of the blocks described with reference to the base stations 202, 204 may be implemented in any number of devices, circuits, electronics, code, or elements. Two or more of the functional blocks may be integrated in a single device, and the functions described as performed in any single block may be implemented over several devices. For example, the functions of the encoder 306, and sequencer 310 may be performed by a single signal processing device 328 in some circumstances. Similarly, the functions of the encoder 307, and sequencer 311 may be performed by a single signal processing device 329 in some circumstances.

Figure 4:
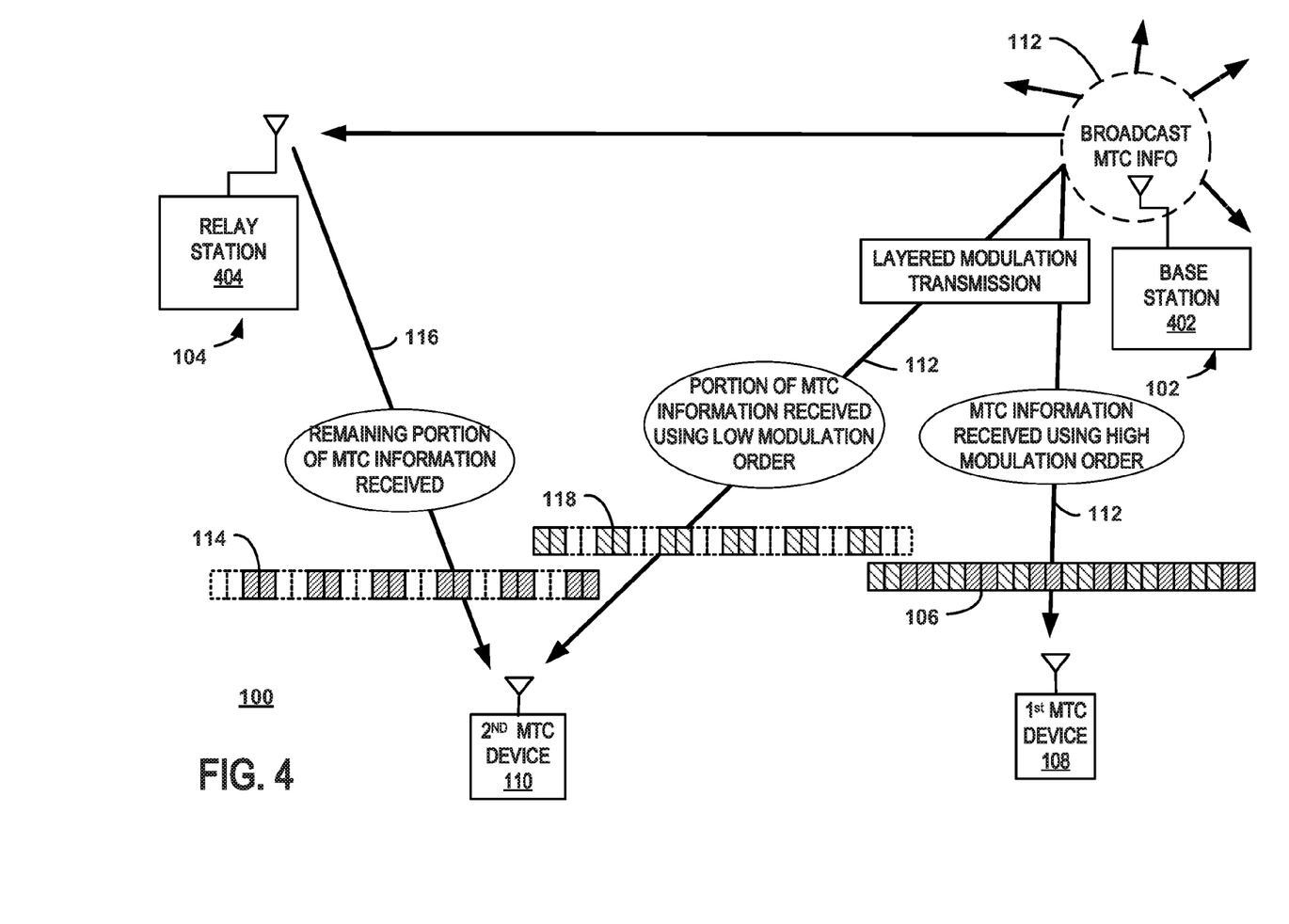
FIG. 4 is a block diagram of the system for an example where the first transceiver station is a base station and the second transceiver station is a relay station.

FIG. 4 is a block diagram of the system 100 for an example where the first transceiver station 102 is a base station 402 and the second transceiver station 104 is a relay station 404. The relay station 404 may be a standalone relay station with limited functionality or may be a base station with relay functionality. In many cases the relay station may be a UE with limited battery life. The relay station 404 at least has the capability of forwarding signals from a base station to one or more UE devices including MTC devices. In typical situations, the relay station 404 also forwards uplink signals from UE devices to the base station.

For the example of FIG. 4, the base station 402 broadcasts a layered modulation signal including the MTC information 106 and the relay station 404 transmits at least a portion of the MTC information in a second transmission 116 wherein the MTC information is received from the base station 402 in the first transmission 112. As discussed above in regard to other examples, a device using the high modulation order to demodulate the first transmission 112 can be recover all of the MTC information 106. As a result, the MTC devices, such as the first MTC device 108, receiving the first transmission above a signal quality threshold can use the high modulation order to demodulate the first transmission and recover the MTC information. The relay station 404 also receives the first transmission 112 above the signal quality threshold in the example. Accordingly, the relay station 404 receives the first transmission 112 and recovers all of the MTC information 106.

The second MTC device 110, however, receives the first transmission 112 below the signal quality threshold and recovers a portion of the MTC information 118 by demodulating the first transmission 112 using the low modulation order. When the second MTC device 110 receives the first transmission 112 it has the option to indicate to the relay station 404 whether the first transmission 112 was received above or below the signal quality threshold. The indication may be in the form of an SNR value or it may be just a 1-bit indication and the need for this indication may be configurable by the relay station 404 or the base station 402. If the relay station 404 received the indication from the MTC device 110 that the first transmission 112 is received above the signal quality threshold then the relay station 404 may refrain from sending the second transmission 114 to conserve power. In the present example, the relay station 404 transmits the remaining portion of the MTC information 114 in the second transmission 116 to the second MTC device 110 allowing the second MTC device to combine the portion 118 received from the base station 402 and the remaining portion 114 received from the relay station 404 to recover all of the MTC information 106.

Any of several techniques can be used by the relay station 404 for transmission of the second transmission 116 where the selected technique may depend on the particular situation. In a first example of relay transmission, the relay station 404 transmits a layered modulation signal that includes all of the MTC information 106. MTC devices receiving the second transmission 116 above the signal quality threshold can recover all of the MTC information by demodulating the second transmission using the high modulation order. MTC devices receiving the second transmission below the threshold can recover the remaining portion of MTC information 114 using the low modulation order to demodulate the second transmission signal. Typically, the sequence of bits in the second transmission is different than the sequence of bits in the first transmission and, for the example, the sequence in the second transmission is the same as the sequence used by the base station 402 for transmitting a second transmission. Therefore, for the first example of relay transmission, the second MTC device 110 can use the high modulation order to receive all of the MTC information from the relay station or can use the lower modulation order to receive the remaining portion of the MTC information not received from the base station in the first transmission 112.

In a second relay transmission example, the relay station 404 only transmits the remaining portion of the MTC information 114 that was not received by the second MTC device 110 from the base station. For the second relay transmission example, the relay station 404 transmits the remaining portion 114 at the lower modulation order. Accordingly, for this situation, the second MTC device 110 can recover the remaining portion 114 using the low modulation order on the second transmission 116. Since the second transmission 116, in this situation, includes only the remaining portion of the MTC information 114, the transmission 116 is shorter than a transmission that includes all of the MTC information 106.

In a third relay transmission example, the relay station 404 transmits only the remaining portion 114 using the high modulation order. Accordingly, the transmission in this situation is shorter than the second transmission in the second relay transmission example.

Figure 5:
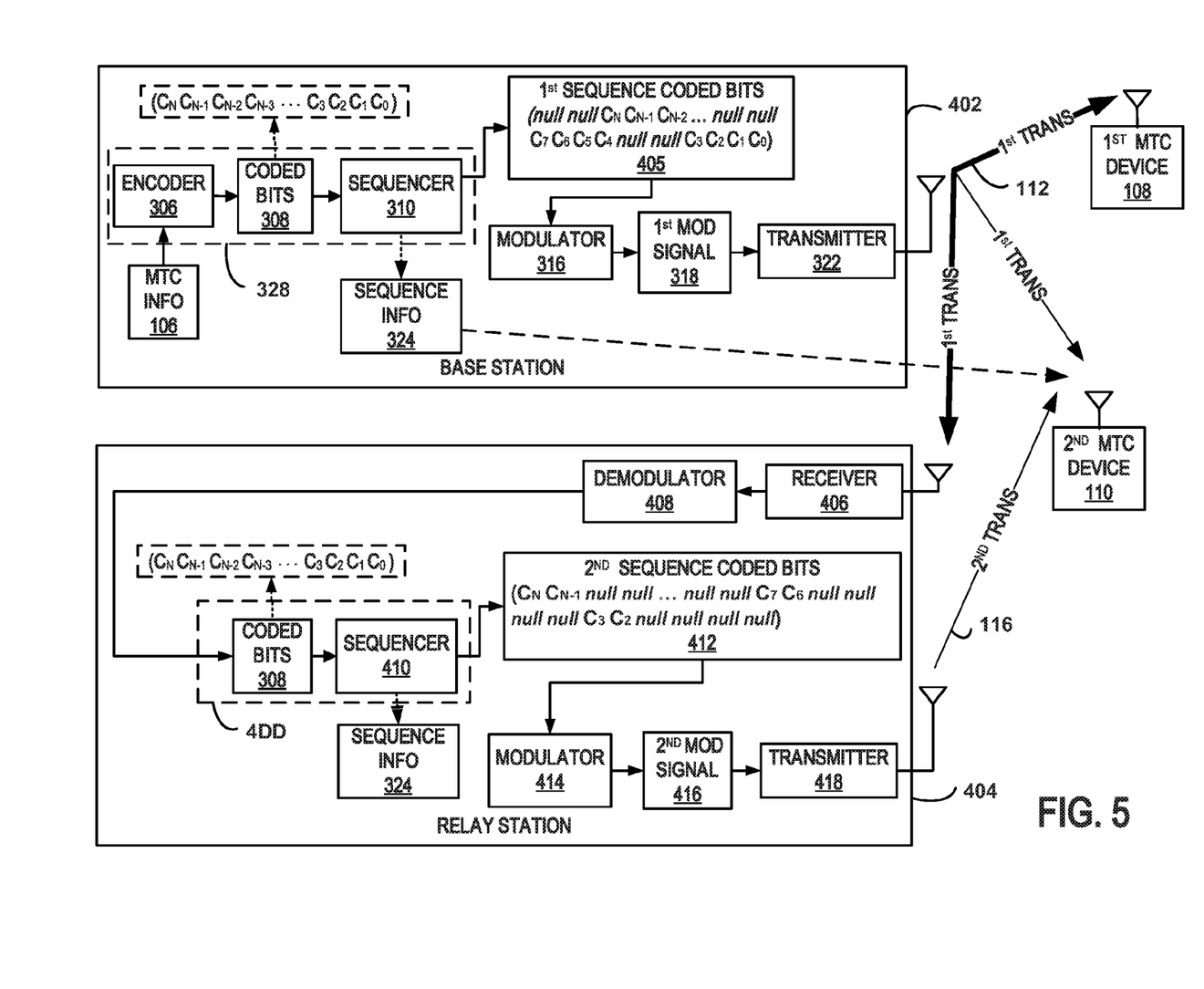
FIG. 5 is a block diagram of the system of FIG. 4 where the base station and the relay station transmit encoded bits representing the MTC information to the MTC devices.

In a fourth relay transmission example, the relay station determines the appropriate modulation order to apply the second transmission and transmits only the remaining portion. The modulation may be selected from the high modulation order and the low modulation order or may be another modulation order. Based on the channel quality feedback from the MTC devices, the relay station may determine what is the best MCS. In another approach, the base station such as an anchor base station, informs the relay station what MCS to use. The anchor base stations typically have good data regarding the channel conditions of the served MTC devices. This information can be delivered either by a unicast transmission to the relay station or on a SIB message. In situations where device to device (D2D) relays stations (ProSe Relays) are implemented, the discovery procedure may be used by the relay station to determine how far the MTC device is located while the connection is established for one-to-one communication FIG. 5 is a block diagram of the system 100 of FIG. 4 where the base station 402 and the relay station 404 transmit encoded bits representing the MTC information 106 to the MTC devices 108, 110. The base station 402 and the relay station 404 each encode and sequence the MTC information 106 into at least one sequence of coded bits, modulate the sequence of coded bits with layered modulation and transmit the modulated sequence. The relay station 404 receives the first sequence of bits 405 from the base station 402 and generates the second sequence of coded bits 412 which is transmitted to the MTC device 110.

The base station 402 operates similarly to the base station 202 in FIG. 2 and FIG. 3 except that, for the example of FIG. 5, the base station 402 sequences the coded bits 308 to create a sequence 405 that includes nulls where the base station 402 does not include information. As a result, transmissions from the relay station 404 and the base station 402 within the same channel will not interfere with each other. For the example, the base station 402 generates at least one sequence of bits of the MTC information that is broadcasted using layered modulation within the service area. In some situations, as discussed above, the base station 402 may also generate a second sequence of bits that is broadcasted allowing MTC devices within the service area to use the lower modulation order to recover the MTC information from the two transmissions. In some situations, the base station 402 may determine whether to transmit the second sequence or to have the relay station 404 transmit the second sequence. Such a determination may be based on serval factors and typically depends on the MTC devices requiring the information and the availability and relative positions of relay stations in the area.

A receiver 406 in the relay station 404 receives the first transmission 112 from the base station 402 that includes the MTC information 106. The demodulator 408 used the high modulation order to recover the coded bits 308 of the MTC information 106. The sequencer 410 in the relay station 404 generates a second sequence of bits 412 based on the coded bits 308 recovered from the received first transmission 112. For the example, the second sequence of bits 412 also includes nulls where no information is included. Therefore, for the example of FIG. 5, the first sequence of coded bits 405 is generically represented as null null CN CN-1 CN-2 . . . null null C7 C6 C5 C4 null null C3 C2 C1 C0 and the second sequence of coded bits is represented as CN CN-1 null null . . . null null C7 C6 null null null null C3 C2 null null null null. The second sequence of bits 412 is modulated by the modulator 414 to form the second modulated signal 416 which is transmitted as the second transmission 116 by the transmitter 418. The modulator 414 may use the low modulation order, the high modulation or another modulation order to generate the second modulated signal 416. For the example, the second transmission 116 includes only the remaining portion of MTC information 114. In some situations, however, the relay station 404 can retransmit all of the MTC information 106 using layered modulation techniques. As an alternative to including nulls in the sequence, the base station can transmit the whole sequence without the nulls and the relay station waits for the base station to finish the transmission before transmitting the second transmission.

In the example of FIG. 5, the second MTC device 110 recovers a portion of the MTC information 118 from the first transmission 112 from the base station 402 using the low modulation order and recovers the remaining portion of the MTC information 114 from the second transmission from the relay station 404 using the low modulation order. In other examples, the remaining portion may be transmitted at a higher modulation order and the second MTC device can recover the remaining portion in less time. For instance, the relay station 404 transmits the second sequence as CN CN-1 CN-4 CN-5 null null . . . C7 C6 C3 C2 null null null null null null null null in another example.

For the example, the sequence information 324 is provided to the MTC device 110. In some situations, the base station 402 may provide the sequence information 324 using the techniques described above. In other situations, the relay station may provide at least a portion of the sequence information. For example, the base station 402 may provide sequence information related to the first and second transmissions. The relay station 404 may provide additional or updated sequence information for the second sequence. Such a situation may occur, where the relay station dynamically determines a modulation order for transmission and modifies the bit sequence. In such situations, however, control signal overhead may be increased.

Figure 6:
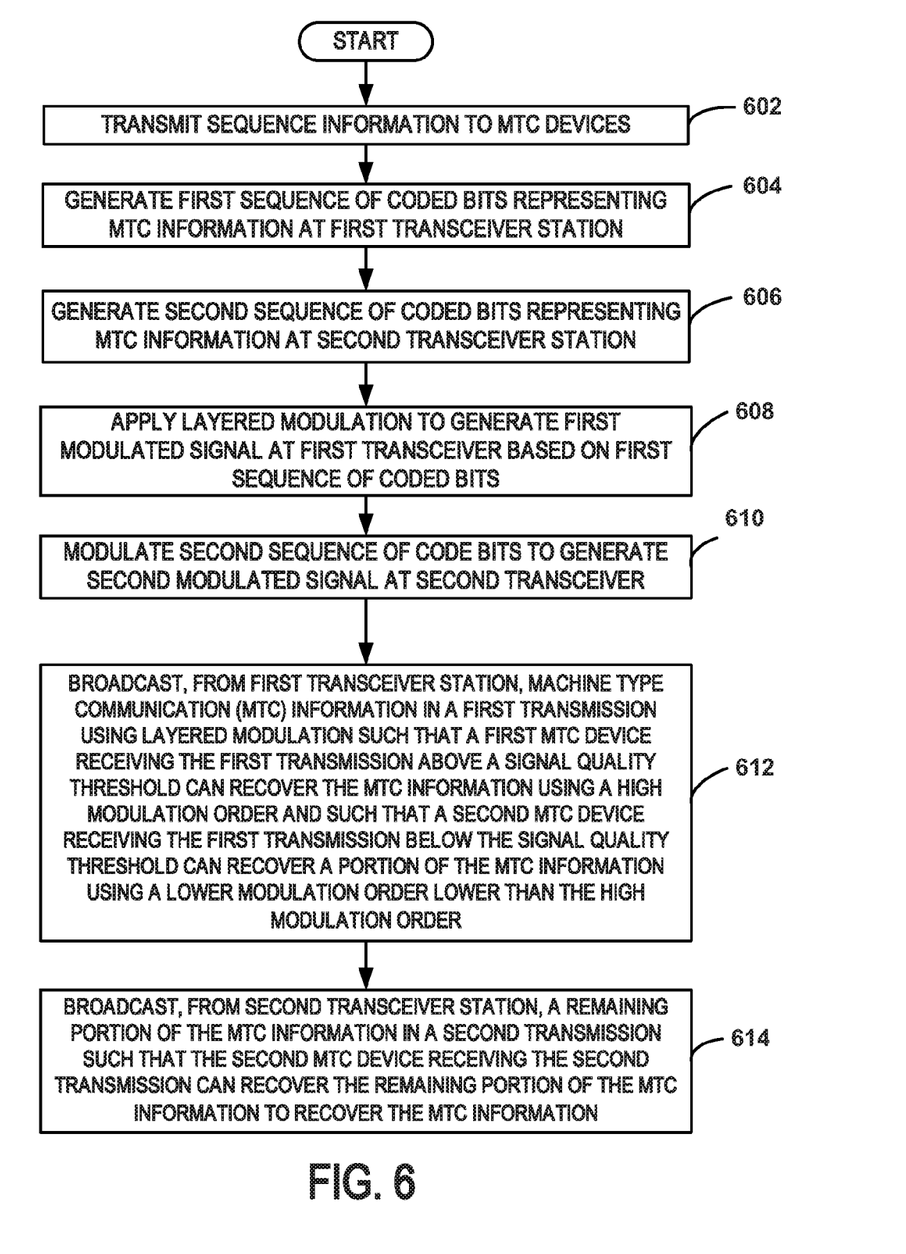
FIG. 6 is a flow chart of an example of a method of broadcasting MTC information from a first transceiver station and second transceiver station.

FIG. 6 is a flow chart of an example of a method of broadcasting MTC information 103 from two transceiver stations. The steps of FIG. 6 can be performed in a different order than shown and some steps may be combined into a single step. Additional steps may be performed and some steps may be omitted.

At step 602, the sequence information 324 is transmitted to the MTC devices in the cell. The sequence information 324 indicates the sequence order of bits in one or more transmissions. The first transceiver 102 such as a base station broadcasts the sequence information 324 as control information over SC-MCCH, MCCH, or System information. In some circumstances, the second transceiver 104 transmits the sequence information 324.

At step 604, a first sequence of coded bits is generated based on the coded bits 308 representing the MTC information. A sequencer at the first transceiver station 102 generates the first sequence of coded bits from the encoded bits representing the MTC information 106. For the example, the sequence of bits represents all the MTC information and is different from the other sequences.

At step 606, a second sequence of bits is generated based on the coded bits representing the MTC information. A sequencer in the second transceiver station generates the second sequence of coded bits. As described above, the first sequence of bits is the original sequence of coded bits for the example and the second sequence may include swapping MSBs with LSBs in sets of bits forming the sequence. The second sequence of bits may include all of the MTC information bits 106 or may include only the remaining portion not yet recovered by a MTC device 110. Where the second transceiver is a relay station, the first sequence of coded nits and the second sequence of coded bits include nulls. In some circumstances, the relay station receives an indication from the MTC devices that the first sequence was received above the signal threshold. In this case the relay station may refrain from transmitting the second sequence to conserve power.

At step 608, layered modulation is applied to the first sequence of bits to generate a first modulated signal. The modulator in the first transceiver modulates the first sequence of coded bits such that a portion may be recovered by applying a low modulation order and all the MTC information can be received by using a high modulation order to demodulate the first modulated signal.

AT step 610, the second transceiver modulates the second sequence of coded bits to generate the second modulated signal. In some circumstances, layered modulation can be sued to modulate the sequence of coded bits that represent all of the MTC information 106. For example, where both transceiver stations are base stations with overlapping service areas, each base station may serve MTC devices that cannot receive transmissions as a sufficient quality to demodulate the signals using the high modulation order. By receiving multiple transmissions with layered modulation from the serving base station, a MTC device can recover all of the MTC information 106. In other circumstances, the transceiver station 104 may use only the high modulation order to modulate the sequence of coded bits representing only the remaining portion of MTC information 114. For example, where the second transceiver station 104 is a relay station 404, the relay station 404 may receive all of the MTC information from the first transmission, generate a second sequence of bits that includes only the remaining portion of MTC information and modulate the sequence with the high modulation order. This may be particularly useful where the targeted MTC device 110 is receiving signals from the relay station at above the signal quality threshold and the reception time can be minimized by using the high modulation order. In still other circumstances, the second transceiver station may apply the low modulation order or another modulation order to modulate the second sequence of coded nits representing only the remaining portion of the MTC information not recovered by the targeted MTC device 110. These techniques may be useful where the second transceiver station is a relay station and the MTC device is not receiving signals from the relay station above a signal quality threshold.

At step 612, the first transceiver station broadcasts the MTC information in the first transmission. As described above the signal is modulated using layered modulation such that MTC devices receiving the transmission above a signal quality threshold can demodulate the transmission to recover all of the MTC information included in the transmission using a high modulation order. Other MTC devices can recover a portion of the MTC information by applying a lower modulation order to demodulate the first transmission.

In one scenario, as discussed above, the transmission may include 16-QAM modulation and 4-QAM modulation such that the MTC information is recoverable by a MTC device by applying 16-QAM demodulation to the transmissions and the portion of MTC information is recoverable by another MTC device by applying 4-QAM to the transmission.

At step 614, the second transceiver station transmits the remaining portion of the MTC information not recovered by the second MTC device form the first transmission. The second transmission is transmitted such that the second device can recover the remaining portion of the MTC information. By combining the portion received in the first transmission and the remaining portion received in the second transmission, the MTC device 110 recovers all of the MTC information 106.

Figure 7:
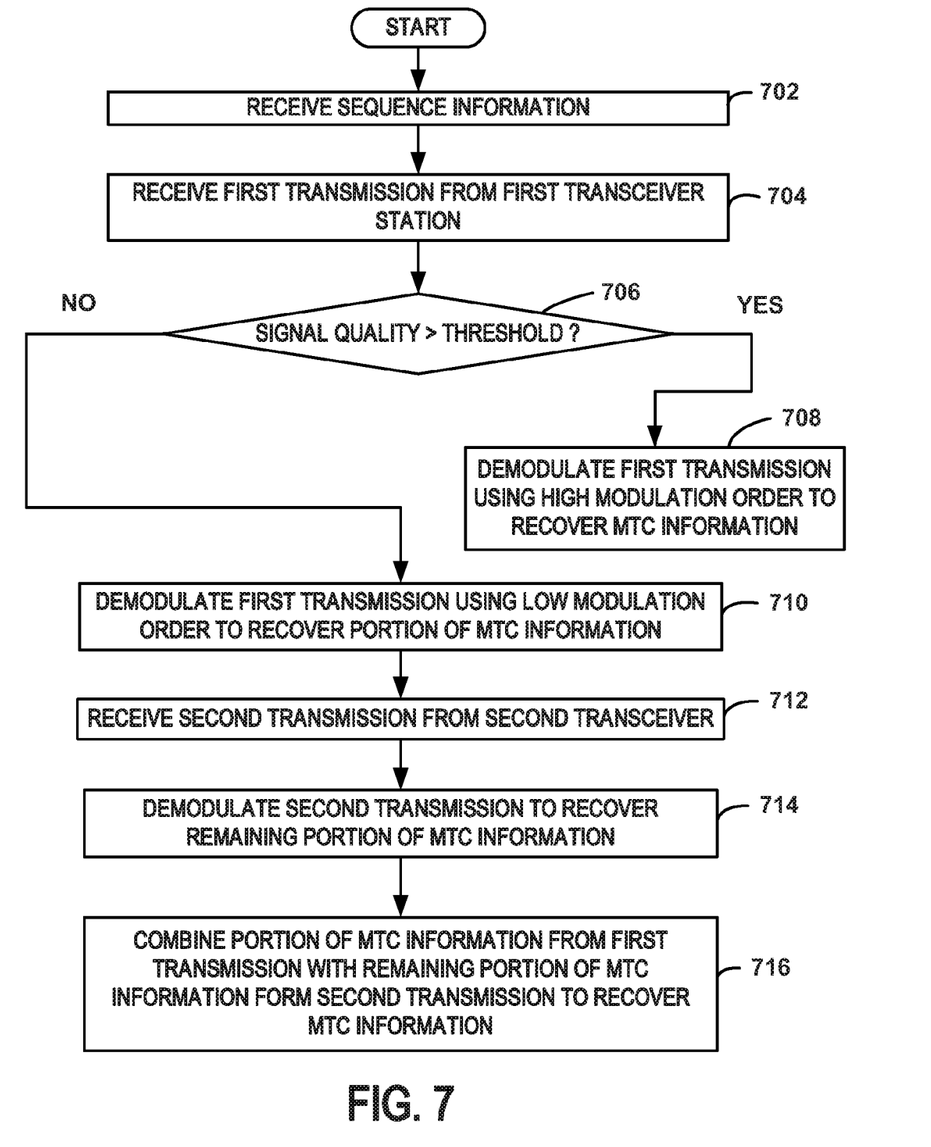
FIG. 7 is a flow chart of a method of receiving MTC information at a MTC device.

FIG. 7 is a flow chart of a method of receiving MTC information at a MTC device. The steps of FIG. 7 can be performed in a different order than shown and some steps may be combined into a single step. Additional steps may be performed and some steps may be omitted. For the example, the method is performed by a MTC UE device such as the MTC device 108 or the MTC device 110.

At step 702, sequence information is received from the either the first transceiver station, the second transceiver station, or both.

At step 704, the MTC device received the first transmission from the first transceiver station.

At step 706, it is determined where the signal quality of the first transmission received from the first transceiver station is above a threshold. The threshold is the minimum quality that allows the MTC device to successfully demodulate the transmission using the high modulation order. The threshold may be, or may be based on any combination of a signal to noise ratio (SNR), signal-to-noise-plus-interference ratio (SNIR). Reference Signal Received Quality (RSRQ) Reference Signal Received Power (RSRP) or any other suitable parameter that allows the MTC device to determine if the higher modulation order can be used.

If the signal quality is above the threshold, the method continues at step 708 where the first transmission is demodulated using the high modulation order (e.g., 16-QAM). The MTC device has the option to inform the second transceiver station if the signal quality is above the threshold. Otherwise, the method continues at step 710.

At step 710, the first transmission is demodulated using the low modulation order to recover the portion of MTC information. When using the lower modulation order, the MTC device retrieves some of the coded bits from the transmission to recover the portion of MTC information.

At step 712, the MTC device received the second transmission from the second transceiver station.

At step 714, the MTC device demodulates the second transmission to recover the remaining portion of the MTC information. The MTC device uses the sequence information to recover the appropriate bits.

At step 716, the MTC device combined the portion of MTC information received in the first transmission with the remining portion of MTC information received in the second transmission to recover all of the MTC information 106.

Clearly, other embodiments and modifications of this invention will occur readily to those of ordinary skill in the art in view of these teachings. The above description is illustrative and not restrictive. This invention is to be limited only by the following claims, which include all such embodiments and modifications when viewed in conjunction with the above specification and accompanying drawings. The scope of the invention should, therefore, be determined not with reference to the above description, but instead should be determined with reference to the appended claims along with their full scope of equivalents.

The invention claimed is:

1. A method comprising:
broadcasting, from a base station, machine type communication (MTC) information in a first transmission using layered modulation such that a first MTC device receiving the first transmission above a signal quality threshold can recover the MTC information using a high modulation order and such that a second MTC device receiving the first transmission below the signal quality threshold can recover a portion of the MTC information using a lower modulation order lower than the high modulation order;
receiving the first transmission at a relay station;
retrieving a remaining portion of the MTC information at the relay station;
receiving, from the second MTC device, an indicator indicating whether the relay station is to transmit the remaining portion of the MTC information, wherein the transmitting, from the relay station, the remaining portion of MTC information is based on the indicator; and
transmitting, from a the relay station, the remaining portion of the MTC information in a second transmission such that the second MTC device receiving the second transmission can recover the remaining portion of the MTC information to recover the MTC information.

2. The method of claim 1, further comprising transmitting sequence information indicating a sequence order of coded bits in at least one transmission of the first transmission and second transmission.

3. The method of claim 2, wherein the transmitting the sequence information comprises transmitting the sequence information as control information within at least one of a Multicast Control Channel (MCCH), a Single Cell Multicast Control Channel (SC-MCCH) and System Information.

4. The method of claim 1, wherein the indicator is based on a received signal quality of the first transmission as received at the second MTC device.

5. The method of claim 1, wherein the transmitting the remaining portion of the MTC information comprises transmitting the remaining portion of the MTC information at the lower modulation order.

6. The method of claim 1, wherein the transmitting the remaining portion of the MTC information comprises transmitting the remaining portion of the MTC information at the higher modulation order.

7. The method of claim 1, wherein the transmitting the remaining portion of the MTC information comprises transmitting a series of bits comprising information bits representing the remaining portion of the MTC information and null bits where no information is transmitted.

8. The method of claim 1, further comprising:
transmitting the MTC information using layered modulation such that a third MTC device receiving the second transmission at another signal quality above the threshold can recover the MTC information using the high modulation order and such that the second MTC device receiving the second transmission below the signal quality threshold can recover the remaining portion of the MTC information using the lower modulation order.

9. A machine type communication (MTC) device comprising:
a receiver configured to:
receive, from a base station, a first signal comprising MTC information, the first signal modulated using layered modulation such that the MTC information is modulated with a high modulation order and that a portion of the MTC information is modulated with a lower modulation order lower than the higher modulation order;
receive, from a relay station, a second signal comprising a remaining portion of the MTC information, wherein the first signal was received at the relay station and the relay station retrieved the remaining portion of the MTC information from the first signal;
a transmitter configured to transmit, to the relay station, an indicator indicating whether the relay station is to transmit the remaining portion of the MTC information, wherein the transmitting, from the relay station, the remaining portion of MTC information is based on the indicator; and
a demodulator configured to demodulate the first signal using the lower modulation order to recover the portion of MTC information and to demodulate the second signal to recover the remaining portion of the MTC information such that the MTC information is received at the MTC device.

10. The MTC device of claim 9, wherein the receiver is further configured to receive sequence information indicating a sequence order of coded bits in at least one transmission of the first transmission and second transmission.

11. The MTC device of claim 10, wherein the sequence information comprises control information within at least one of a Multicast Control Channel (MCCH), a Single Cell Multicast Control Channel (SC-MCCH) and System Information.

12. The MTC device of claim 9, wherein the demodulator is configured to demodulate the second signal using the lower modulation order.

13. A relay station comprising:
- a receiver configured to:
  - receive, from a base station, machine type communication (MTC) information in a first transmission using layered modulation such that a first MTC device receiving the first transmission above a signal quality threshold can recover the MTC information using a high modulation order and such that a second MTC device receiving the first transmission below the signal quality threshold can recover a portion of the MTC information using a lower modulation order lower than the high modulation order, and
  - receive, from the second MTC device, an indicator indicating whether the relay station is to transmit a remaining portion of the MTC information, wherein the transmitting, from the relay station, the remaining portion of MTC information is based on the indicator;
- a controller configured to retrieve the remaining portion of the MTC information from the received first transmission; and
- a transmitter configured to transmit the remaining portion of the MTC information in a second transmission such that the second MTC device receiving the second transmission can recover the remaining portion of the MTC information to recover the MTC information.

14. The relay station of claim 13, wherein sequence information indicating a sequence order of coded bits is transmitted in at least one transmission of the first transmission and second transmission.

15. The relay station of claim 14, wherein the sequence information comprises sequence information transmitted as control information within at least one of a Multicast Control Channel (MCCH), a Single Cell Multicast Control Channel (SC-MCCH) and System Information.

16. The relay station of claim 13, wherein the indicator is based on a received signal quality of the first transmission as received at the second MTC device.

17. The relay station of claim 13, wherein the transmitter is configured to transmit the remaining portion of the MTC information at the lower modulation order.

18. The relay station of claim 13, wherein the transmitter is configured to transmit the remaining portion of the MTC information at the higher modulation order.

19. The relay station of claim 13, wherein the transmitter is configured to transmit a series of bits comprising information bits representing the remaining portion of the MTC information and null bits where no information is transmitted.

* * * * *